United States Patent
Braun et al.

(10) Patent No.: US 8,969,276 B2
(45) Date of Patent: Mar. 3, 2015

(54) AQUEOUS ACIDIC ETCHING SOLUTION AND METHOD FOR TEXTURING THE SURFACE OF SINGLE CRYSTAL AND POLYCRYSTAL SILICON SUBSTRATES

(75) Inventors: Simon Braun, Mannheim (DE); Julian Proelss, Worms (DE); Ihor Melnyk, Constance (DE); Michael Michel, Berlin (DE); Stefan Mathijssen, Constance (DE)

(73) Assignee: BASF SE, Ludwigshafen (DE)

( * ) Notice: Subject to any disclaimer, the term of this patent is extended or adjusted under 35 U.S.C. 154(b) by 306 days.

(21) Appl. No.: 13/394,349

(22) PCT Filed: Sep. 9, 2010

(86) PCT No.: PCT/EP2010/063209
§ 371 (c)(1),
(2), (4) Date: Mar. 6, 2012

(87) PCT Pub. No.: WO2011/032880
PCT Pub. Date: Mar. 24, 2011

(65) Prior Publication Data
US 2012/0160320 A1   Jun. 28, 2012

Related U.S. Application Data

(60) Provisional application No. 61/244,090, filed on Sep. 21, 2009.

(51) Int. Cl.
*H01L 31/0236* (2006.01)
*C09K 13/08* (2006.01)
*C11D 11/00* (2006.01)

(52) U.S. Cl.
CPC ............ *C09K 13/08* (2013.01); *C11D 11/0047* (2013.01); *H01L 31/02363* (2013.01); *Y02E 10/50* (2013.01)
USPC ........ 510/175; 252/79.1; 252/79.2; 252/79.3; 438/71

(58) Field of Classification Search
CPC ................................................. H01L 31/02363
USPC ........... 510/175; 252/79.1, 79.2, 79.3; 438/71
See application file for complete search history.

(56) References Cited

U.S. PATENT DOCUMENTS

| | | | | |
|---|---|---|---|---|
| 4,220,706 A | * | 9/1980 | Spak | 430/318 |
| 4,857,225 A | * | 8/1989 | Terada et al. | 510/257 |
| 4,971,654 A | * | 11/1990 | Schnegg et al. | 438/752 |
| 5,330,558 A | * | 7/1994 | McCormick et al. | 75/715 |
| 5,705,082 A | * | 1/1998 | Hinson | 216/95 |
| 5,949,123 A | | 9/1999 | Le et al. | |
| 6,340,040 B1 | | 1/2002 | Ikeda | |
| 6,340,640 B1 | * | 1/2002 | Nishimoto et al. | 438/753 |
| 6,440,224 B1 | * | 8/2002 | Wei et al. | 134/3 |
| 6,553,788 B1 | * | 4/2003 | Ikeda et al. | 65/31 |
| 7,192,885 B2 | | 3/2007 | Hauser et al. | |
| 8,043,525 B2 | * | 10/2011 | La et al. | 252/79.1 |
| 8,691,705 B2 | * | 4/2014 | Huang et al. | 438/745 |
| 2008/0041823 A1 | * | 2/2008 | La et al. | 216/97 |
| 2009/0146101 A1 | * | 6/2009 | Huang et al. | 252/79.3 |
| 2010/0178636 A1 | * | 7/2010 | Stephan et al. | 433/201.1 |
| 2010/0218827 A1 | * | 9/2010 | Aono et al. | 136/264 |
| 2010/0236627 A1 | * | 9/2010 | Yago et al. | 136/261 |
| 2011/0084238 A1 | | 4/2011 | Hibst et al. | |
| 2011/0104840 A1 | * | 5/2011 | Burdinski et al. | 438/34 |

FOREIGN PATENT DOCUMENTS

| | | | |
|---|---|---|---|
| DE | 197 46 706 | | 11/1998 |
| DE | 10 2007 004 060 | | 7/2008 |
| EP | 0 773 590 | | 5/1997 |
| GB | 1206756 | A * | 9/1970 |
| JP | 57 47744 | | 3/1982 |
| JP | 2001-023947 | | 1/2001 |
| JP | 2004 63744 | | 2/2004 |
| JP | 2005-150171 | | 6/2005 |
| JP | 2005 311060 | | 11/2005 |
| JP | 2006-294752 | | 10/2006 |
| KR | 1020080018010 | | 2/2008 |
| SU | 293873 | A * | 1/1971 |
| WO | 01 47032 | | 6/2001 |
| WO | 2004 100244 | | 11/2004 |

OTHER PUBLICATIONS

International Search Report Issued Dec. 3, 2010 in PCT/EP10/63209 Filed Sep. 9, 2010.
U.S. Appl. No. 12/995,291, filed Apr. 13, 2011, Hibst, et al.
Office Action issued Aug. 26, 2014 in JP Patent Application No. 2012-529216 with English translation.

* cited by examiner

*Primary Examiner* — Gregory Webb
(74) *Attorney, Agent, or Firm* — Oblon, McClelland, Maier & Neustadt, L.L.P.

(57) ABSTRACT

An aqueous acidic etching solution suitable for texturing the surface of single crystal and polycrystal silicon substrates and containing, based on the complete weight of the solution, 3 to 10% by weight of hydrofluoric acid; 10 to 35% by weight of nitric acid; 5 to 40% by weight of sulfuric acid; and 55 to 82% by weight of water; a method for texturing the surface of single crystal and polycrystal silicon substrates comprising the step of (1) contacting at least one major surface of a substrate with the said aqueous acidic etching solution; (2) etching the at least one major surface of the substrate for a time and at a temperature sufficient to obtain a surface texture consisting of recesses and protrusions; and (3) removing the at least one major surface of the substrate from the contact with the aqueous acidic etching solution; and a method for manufacturing photovoltaic cells and solar cells using the said solution and the said texturing method.

25 Claims, No Drawings

US 8,969,276 B2

AQUEOUS ACIDIC ETCHING SOLUTION AND METHOD FOR TEXTURING THE SURFACE OF SINGLE CRYSTAL AND POLYCRYSTAL SILICON SUBSTRATES

FIELD OF THE INVENTION

The present invention is directed to a novel aqueous acidic etching solution useful for texturing the surface of single crystal and polycrystal silicon substrates. Moreover, the present invention is directed to a novel method for texturing the surface of single crystal and polycrystal silicon substrates making use of the novel aqueous acidic etching solution.

CITED DOCUMENTS

The documents cited in the present application are incorporated by reference in their entirety.

BACKGROUND OF THE INVENTION

Texturing consists in creating a certain roughness at the surface of a substrate in order to enable multiple reflection of light incident on its surface, thereby leading to greater absorption of the light inside the substrate, i.e., to an increased light-confining effect. The roughness obtained in this way has two complementary effects: the first effect is to reduce the reflecting power or optical reflectivity of the surface; the second effect is to increase the length of the optical path traveled by the incident light inside the substrate. In a photocell, photovoltaic cell or solar cell, the increased light-confining effect gives rise to an increase in the effectiveness with which light is transformed into electricity.

Customarily, the roughness or texture of the surface of a substrate, in particular of a silicon or silicon alloy substrate or wafer may include randomized pyramids or a multitude of pits having a depth in the range of from 0.1 to 10 µm and a diameter in the range of from 0.1 to 10 µm.

Various methods have been proposed for texturing the surface of the said substrates.

Mention may be made of methods such as mechanical engraving, laser etching, photolithography, masking, sandblasting, mortizing, anodic oxidation, sputter etching, etc. However, these methods are complex and expensive to implement (cf. also the international patent application WO 01/47032 A1, page 2, line 26, to page 3, line 7).

The single crystal silicon substrates are mainly produced by sawing massive silicon ingots. However, crystal defects having a depth of several µm are caused by the sawing, which is known in the art as saw damage. Since these crystal defects are centres for the recombination of electron-hole pairs, it is necessary to remove them by way of a so-called saw damage etch.

The method of surface texturing presently employed on an industrial scale is characterized by the use of aqueous alkaline solutions based on sodium hydroxide or potassium hydroxide. These solutions have the property of etching silicon anisotropically depending on the crystallographic orientation of the grains situated at the surface, thereby modifying the surface morphology of the silicon. Etching speed is about 100 times greater on planes having the crystallographic orientation [100] than on [111] planes. This causes the surface to be textured in the form of randomized pyramids situated on [100] planes that trap the incident light, which effect is referred to as "micro-texturing". However, for polycrystal silicon substrates, it is estimated that only 20% of the surface is constituted by grains having this crystallographic orientation. Therefore, the treatment is less effective with respect to optical reflectivity. This equally applies to silicon substrates manufactured by the edge defined film-fed growth (EFG) process or by the string ribbon process, which processes do not require sawing (cf. also the international patent application WO 01/47032 A1, page 1, line 22 to page 2, line 25). Thus, the treatment is fully effective only in the special case of single crystal silicon substrates having crystallographic orientation [100] at the surface to be etched.

In order to ameliorate these problems and drawbacks, aqueous acidic etching solutions and methods of their use have been developed in the past.

Thus, the American U.S. Pat. No. 5,949,123 or the European patent EP 0 773 590 B1 disclose an aqueous acidic etching solution containing hydrofluoric acid and nitric acid in a weight ratio of 1:3. This etching solution is used for creating pores in the silicon surface thereby creating a porous layer. In a second step, the porous layer is removed with an alkaline solution of sodium hydroxide, thereby creating the surface texture. Sulfuric acid is not used as a component.

The American U.S. Pat. No. 6,340,640 B1 or the German patent application DE 197 46 706 A1 disclose an acidic etching solution containing 12 parts by volume of 50% by weight of hydrofluoric acid, one part by volume of 69% by weight of nitric acid and 12 parts by volume of 85% by weight of phosphoric acid. Instead of the phosphoric acid, a carboxylic acid having a higher molecular weight than acetic acid can be used. Additionally, the acidic etching solution can also contain surfactants or ammonium fluoride. Sulfuric acid is not used as a component.

The international patent application WO 01/47032 A1 discloses acidic etching solutions containing 1 to 30% by weight of hydrofluoric acid, 5 to 30% by weight of nitric acid and 50 to 94% by weight of sulfuric acid and/or phosphoric acid. The preferred composition contains 10 to 16% by weight of hydrofluoric acid, 15 to 25% by weight of nitric acid, 15 to 25% by weight of sulfuric acid, 14 to 20% by weight of phosphoric acid and 20 to 30% by weight of water. An even more preferred composition contains 3 to 7% by weight of hydrofluoric acid, 3 to 7% by weight of nitric acid, 75 to 85% by weight of sulfuric acid and 5 to 15% by weight of water.

The Japanese patent application JP 2004-063744 discloses a two-step etching process, wherein an aqueous acidic etching solution A containing 36 to 42% by weight of hydrofluoric acid and 6 to 10% by weight of nitric acid and an aqueous acidic etching solution B containing 32 to 46% by weight of hydrofluoric acid and 2 to 6% by weight of nitric acid are used. Sulfuric acid is not used as a component.

The American U.S. Pat. No. 7,192,885 B2 or the international patent application WO 2004/100244 A1 disclose an aqueous acidic etching solution containing 10 to 40% by weight of concentrated hydrofluoric acid, 2 to 60% by weight of concentrated nitric acid and 20 to 55% by weight of water. Sulfuric acid is not used as a component.

The Japanese patent application JP 2005-311060 discloses an aqueous acidic etching solution containing 10 to 22% by weight of hydrofluoric acid, 15 to 31% by weight of nitric acid, the remainder being water. Sulfuric acid is not mentioned as a component.

The German patent application DE 10 2007 004 060 A1 discloses an aqueous acidic solution containing 0.8 to 2% by weight of hydrofluoric acid 15 to 40% by weight of nitric acid, 10 to 41% by weight of sulfuric acid, the remainder being 74.2% by weight or less of water. A preferred solution contains 1 to 1.7% by weight of hydrofluoric acid, 20 to 30% by weight of nitric acid, 18 to 35% by weight of sulfuric acid and 61% by weight or less of water. A particularly preferred solution contains 1.4% by weight of hydrofluoric acid, 27% by weight of nitric acid, 26% by weight of sulfuric acid, and 45.6% by weight of water. However, this solution is primarily used for the wet chemical edge isolation and, therefore, is used to solve a technical problem which is different from the problems of the texturing of surfaces. If it is used for this purpose, it exhibits only little etching power and leads to comparatively smooth surfaces.

Moreover, several commercial aqueous acidic etching solutions are available in the market.

For example, Spin-Etch™ BT contains 10 to 20% by weight of hydrofluoric acid, 20 to 30% by weight of nitric acid, 15 to 25% by weight of sulfuric acid and 10 to 20% by weight of phosphoric acid, the remainder being 35% by weight or less of water.

SI-Polish-Etch™ I contains 5 to 10% by weight of hydrofluoric acid, 36 to 38% by weight of nitric acid, 9 to 13% by weight of sulfuric acid and 16 to 20% by weight of phosphoric acid, the remainder being 34% by weight or less of water.

Spin-Etch™ D contains 1 to 7% by weight of hydrofluoric acid, 35 to 45% by weight of nitric acid, 10 to 20% by weight of sulfuric acid and 15 to 25% by weight of phosphoric acid, the remainder being 39% by weight or less of water.

Spin-Etch™ E contains 1 to 5% by weight of hydrofluoric acid, 5 to 10% by weight of nitric acid and 75 to 85% by weight of sulfuric acid, the remainder being 19% by weight or less of water.

Although these prior art aqueous acidic etching solutions are capable of ameliorating some of the problems and drawbacks associated with the aqueous alkaline etching solutions, they require a constant development to improve and balance their applicational property profile in order to meet the demands of the market. In particular, a more uniform color of the etched silicon substrates or wafers is required for aesthetic reasons, when the solar cells manufactured with these wafers are to be used in urban areas. Additionally, the grain boundary etching or defect etching, including the etching of crystal dislocation clusters, ought to be decreased in order to improve the stability of the silicon wafers and to lessen the risk of breakage of the silicon wafers and the solar cells, in particular during production. Last but not least, the efficiencies of the photovoltaic cells or solar cells needs constant improvement.

OBJECTS OF THE INVENTION

It was an object of the present invention to provide a novel, aqueous acidic etching solution which is particularly suitable for texturing the surface of single crystal and polycrystal silicon substrates or wafers and does no longer exhibit the drawbacks of the prior art aqueous acidic etching solutions.

In particular, the novel aqueous acidic etching solution should exhibit an improved and a particularly well-balanced property profile in order to meet the increasing demands of the solar cells industry and its customers. Furthermore, for aesthetic reasons, a more uniform color of the etched silicon substrates or wafers and of the solar cells manufactured therefrom should be achieved by way of the novel aqueous acidic etching solution. Additionally, the novel aqueous acidic etching solution should exhibit a much less pronounced grain boundary etching or defect etching, including the etching of crystal dislocation clusters, in order to improve the stability of the silicon wafers and of the solar cells, in particular during their production and handling. Last but not least, the novel aqueous acidic etching solution should cause an increase of the efficiencies of the photovoltaic cells or solar cells manufactured from the silicon wafers textured with the said solution.

It was another object of the invention to provide a novel method for texturing the surface of single crystal and polycrystal silicon substrates or wafers, which novel method does no longer exhibit the drawbacks of the prior art methods.

In particular, the novel method should meet the increasing demands of the solar cells industry and its customers. Furthermore, the novel method should yield etched silicon substrates or wafers with an improved uniform color so that, in turn, solar cells having also an improved uniform color can be produced. This is particularly important, when such solar cells are to be used in urban areas. Additionally, the novel method should lead to a much less pronounced grain boundary etching and to a significantly higher stability of the silicon wafers and of the solar cells produced therefrom, in particular during their production and handling. Last but not least, the novel method should yield textured silicon wafers which, in turn, yield photovoltaic cells or solar cells with increased efficiencies.

SUMMARY OF THE INVENTION

Accordingly, the novel aqueous acidic etching solution has been found, the said solution being suitable for texturing the surface of single crystal and polycrystal silicon substrates and containing, based on the complete weight of the solution, 3 to 10% by weight of hydrofluoric acid;
10 to 35% by weight of nitric acid;
5 to 40% by weight of sulfuric acid; and
55 to 82% by weight of water.

Hereinafter, the novel aqueous acidic etching solution is referred to as the "etching solution of the invention".

Moreover, the novel method for texturing the surface of single crystal and polycrystal silicon substrates has been found, the said method comprising the steps of (1) contacting at least one major surface of a single crystal or polycrystal silicon substrate with an aqueous acidic etching solution containing, based on the complete weight of the solution,
   3 to 10% by weight of hydrofluoric acid;
   10 to 35% by weight of nitric acid;
   5 to 40% by weight of sulfuric acid; and
   55 to 82% by weight of water;
(2) etching the at least one major surface of a single crystal or polycrystal silicon substrate for a time and at a temperature sufficient to obtain a surface texture consisting of recesses and protrusions; and
(3) removing the at least one major surface of the single crystal or polycrystal silicon substrate from the contact with the aqueous acidic etching solution.

Hereinafter the novel method for texturing the surface of a single crystal or polycrystal substrate is referred to as the "method of the invention".

Last but not least, a new method for manufacturing devices generating electricity upon the exposure to electromagnetic radiation has been found, which makes use of the etching solution of the invention and the method of the invention and which is hereinafter referred to as the "manufacturing method of the invention".

ADVANTAGES OF THE INVENTION

In view of the prior art discussed above, it was surprising and could not be expected by the skilled artisan that the objects underlying the present invention could be solved by the etching solution of the invention and the method of the invention.

Thus, it was surprising that the etching solution of the invention no longer exhibited the drawbacks of the prior art etching solutions.

It was particularly surprising that the etching solution of the invention exhibited an improved and a particularly well-balanced property profile which could perfectly meet the increasing demands of the solar cells industry and its customers. Furthermore, for aesthetic reasons, a more uniform color of the etched silicon substrates or wafers and of the solar cells manufactured therefrom could be achieved by way of the etching solution of the invention. Additionally, the etching solution of the invention exhibited a much less pronounced grain boundary etching which considerably improved the stability of the silicon wafers and of the solar cells, in particular during their production and handling. Last but not least, the etching solution of the invention caused an increase of the efficiencies of the photovoltaic cells or solar cells manufactured from the silicon wafers textured with the etching solution of the invention.

Moreover, it was surprising that the method of the invention no longer exhibited the drawbacks of the prior art etching solutions.

It was particular surprising that the method of the invention could meet the increasing demands of the solar cells industry and its customers. Furthermore, the novel method yielded etched silicon substrates or wafers with an improved uniform color so that, in turn, solar cells having also an improved uniform color could be produced. This was particularly important, as such solar cells are used in urban areas. Additionally, the method of the invention led to a much less pronounced grain boundary etching or defect etching, including the etching of crystal dislocation clusters, and, therefore, to a significantly higher stability of the silicon wafers and of the solar cells produced therefrom, in particular during their production and handling.

Last but not least, the method of the invention yielded textured silicon wafers which were excellently suited for manufacturing mechanically stable devices which generate electricity upon the exposure to electromagnetic radiation with increased efficiencies, in particular photovoltaic cells or solar cells.

DETAILED DESCRIPTION OF THE INVENTION

In its broadest aspect, the present invention is directed to the etching solution of the invention.

The etching solution of the invention is particularly useful and suitable for texturing the surface of single crystal and polycrystal silicon substrates, including single crystal and polycrystal silicon alloy substrates, in particular silicon germanium alloy substrates.

Most preferably, the single crystal and polycrystal silicon substrates are wafers useful for manufacturing photovoltaic or solar cells. Such wafers can have different sizes. Preferably, they are 100 to 210 mm square or pseudosquare. Likewise, the thickness of the wafers can vary. Preferably, the thickness is in the range of 80 to 300 μm.

As is known in the art, single crystal and polycrystal silicon wafers can be produced in accordance with known and customary methods. Thus, single crystal and polycrystal silicon wafers can be manufactured by cutting silicon ingots or bricks. The single crystal ingots are e.g. grown with the Czochralski (CZ) method, by slowly pulling a seed shaft out of molten silicon, which is contained in a fusion furnace. The polycrystalline silicon can be produced by heating silicon pieces in a crucible just above their melting temperature. This lets the silicon pieces grow together forming a massive silicon block.

This block is cut into bricks. The ingots or bricks are finally cut into wafers with wire saws. However, as explained hereinbefore, a saw damage etch must be carried out after the sawing.

After their production, the wafers are customarily checked for breakages and other errors, and are sorted into the solar cell production process.

The virgin etching solution of the invention, i.e., the etching solution of the invention has produced, contains the essential components hydrofluoric acid, nitric acid, sulfuric acid and water in the concentrations set out below. The virgin etching solution of the invention may contain at least one additional functional component. However, it is particularly preferred that it consists essentially of or consists of the said four essential components. "Consisting essentially of" means that it contains additional components only in trace amounts. "Consisting of" means that it contains additional components in amounts below their limits of detection.

Of course, when the etching solution of the invention is used in the method of the invention, a certain concentration of hexafluorosilicic acid will establish, the hexafluorosilicic acid being produced by the texturing and partial dissolution of the silicon.

The etching solution of the invention contains, based on the complete weight of the solution, 3 to 10% by weight of hydrofluoric acid;
10 to 35% by weight of nitric acid;
5 to 40% by weight of sulfuric acid; and
55 to 82% by weight of water.

It is particularly preferred that the molar ratio of hydrofluoric acid to nitric acid in the said etching solution of the invention is from a 3:1 to 1:3.7.

More preferably, the etching solution of the invention contains, based on the complete weight of the solution, 4 to 7% by weight of hydrofluoric acid;
12 to 22% by weight of nitric acid;
12 to 20% by weight of sulfuric acid; and
51 to 72% by weight of water.

It is particularly preferred that the molar ratio of hydrofluoric acid to nitric acid in the said etching solution of the invention is from 1.84:1 to 1:1.75.

Even more preferably, the etching solution of the invention contains, based on the complete weight of the solution, 5 to 7% by weight of hydrofluoric acid;
16 to 22% by weight of nitric acid;
10 to 19% by weight of sulfuric acid; and
52 to 64% by weight of water.

It is particularly preferred that the molar ratio of hydrofluoric acid to nitric in the said etching solution of the invention acid is from 1.4:1 to 1:1.4.

It is more particularly preferred that the molar ratio of hydrofluoric acid to nitric acid in the etching solutions described hereinbefore is from 1.2:1 to 1:1.2, even more particularly preferably from 1.1:1 to 1:1.1 and, most preferably, 1:1.

The preparation of the etching solution of the invention does not offer any particularities but can be carried out by adding hydrofluoric acid, nitric acid and sulfuric acid in the desired amounts to water. For this purpose, the customary and standard mixing processes and acid corrosion resistant mixing devices such as agitated vessels, in-line, dissolvers, high shear impellers, ultrasonic mixers, homogenizer nozzles or counterflow mixers can be used. Preferably, chemicals of high purity such as HF, HNO₃, H₂SO₄ Selectipur™ or Seluris™ and deionized water are used.

The etching solution of the invention is most excellently suited for texturing the surface surface of single crystal and polycrystal silicon substrates, in particular the wafers described above, in accordance with the method of the invention.

In the first step of the method of the invention, at least one major surface and, preferably, the two major surfaces lying opposite to each other of the single crystal or polycrystal silicon substrate are contacted with the etching solution of the invention.

This can be accomplished, for example, by dipping at least one silicon substrate in its entirety either horizontally or vertically in a tank filled with the etching solution of the invention or by conveying at least one silicon substrate essentially horizontally through the tank filled with the etching solution of the invention, as described, for example, in the American U.S. Pat. No. 7,192,885 B2.

In the second process step of the method of the invention, the at least one, preferably one major surface of the substrate is etched for a time and at a temperature sufficient to obtain the surface texture consisting of recesses and protrusions.

Preferably, the etching time is from 1 to 10 minutes, more preferably from 1 to 7.5 minutes and, most preferably, from 1 to 5 minutes.

Preferably, the etching temperature is in the range of from 0 to 50° C., more preferably, from 0 to 40° C. and most preferably from 0 to 30° C.

Preferably, the surface texture obtained consists of a multitude of pits preferably having a depth in the range of from 0.1 to 15 μm, preferably 0.1 to 10 μm.

More preferably, the pits have a diameter in the range of from 0.1 to 15 μm, preferably 0.1 to 10 μm.

Most particularly preferably, the pits have a depth in the range of from 0.1 to 15 μm, preferably 0.1 to 10 μm and a diameter in the range of from 0.1 to 15 μm, preferably 0.1 to 10 μm.

Due to the etching solution, the method of the invention can be carried out comparatively fast leading to less breakage of the wafers.

Therefore, the etching solution and the method of the invention are particularly well suited for the manufacture of mechanically stable devices which generate electricity upon the exposure to electromagnetic radiation in accordance with the manufacturing method of the invention. In particular, the electromagnetic radiation concerned is solar light, and the devices are photovoltaic cells or solar cells.

The manufacturing method of the invention yields devices, in particular solar cells, of high efficiencies and a uniform appearance in exceptionally high yields.

EXAMPLES AND COMPARATIVE EXPERIMENTS

Example 1 and Comparative Experiment CE1

Small-Scale Industrial Production of Solar Cells

In the example 1, the virgin aqueous acidic etching solution ("solution 1") consisting of
  6% by weight of hydrofluoric acid;
  18.6% by weight of nitric acid;
  18.8% by weight of sulfuric acid; and
  62.6% by weight of water
and having a molar ratio of hydrofluoric acid to nitric acid of 1:1 was used.

In the comparative experiment CE1, a virgin aqueous acidic etching solution according to the American U.S. Pat. No. 7,192,885 B2 ("solution CE1") consisting of
  11.54% by weight of hydrofluoric acid;
  30% by weight of nitric acid; and
  58.46% by weight of water
and having a molar ratio of hydrofluoric acid to nitric acid of 1.21:1 was used.

Two small-scale productions of solar cells were carried out in a standard line industrial machine comprising a wet-texturing station ("InTex"), a diffusion furnace for n-type doping "Diffusion"), a wet-etching station for removing phosphorus silicate glass (PSG), a station for applying an antireflective coating by plasma enhanced chemical vapor deposition ("PE-CVD"), and stations for screenprinting for applying the silver mesh and the electrical contacts, for the fast firing of the metallization, for the laser edge isolation and for the classification (hereinafter collectively referred to as "Printing").

The resulting wafers of each series were processed into complete solar cells, and their electrical characteristics were determined. The Table 1 shows the obtained results.

TABLE 1

The Electrical Characteristics of the Solar Cells of Example 1 and of the Comparative Experiment CE1

|   | No. of cells produced | $U_{OC}$/V | $I_{SC}$/mA/cm² | Filling Factor FF/% | Effeciency Eff/% |
|---|---|---|---|---|---|
| 1 | 1910 | 0.615 | 33.59 | 77.22 | 15.96 |
| CE1 | 1874 | 0.614 | 33.53 | 77.11 | 15.87 |

The data of the Table 1 demonstrate that the solar cells of the example 1 had a higher efficiency (0.1%) than the solar cells of the comparative experiment CE1.

Example 2 and Comparative Experiment CE2

Large-Scale Production of Solar Cells

For the example 2, the example 1 was repeated only that the number of solar cells produced was by approximately two orders of magnitude higher.

For the comparative experiment CE2, the comparative experiment CE1 was repeated only that the number of solar cells produced was by two orders of magnitude higher.

In order to achieve etching-bath lifetimes of 50,000 and more wafers, it was necessary to dose the components into the etching-baths. In general, only small amounts of water needed to be dosed to the etching-baths. It was often not even necessary to add any water at all because the water included in the added acids was sufficient. Sulfuric acid was dosed in concentrations similar to the concentrations in the initial etching-baths. Nitric acid and, in particular, hydrofluoric acid were dosed in concentrations which were higher than in the initial etching-baths. After processing about 100,000 wafers, the etching-bath of the example 2 contained about
  4.2% by weight of hydrofluoric acid;
  12.2% by weight of nitric acid;
  12.4% by weight of sulfuric acid;
  58.2% by weight of water; and
  13% by weight of hexafluorosilicic acid,
and the etching-bath of the comparative experiment CE2 contained about
  6.5% by weight of hydrofluoric acid;
  26% by weight of nitric acid;

54.4% by weight of water; and 13.1% by weight of hexafluorosilicic acid, the weight percentages being based on a complete weight of the respective etching-bath. In each case, the hexafluorosilicic acid was generated by the texturing and the partial dissolution of the silicon wafers. It is assumed, that all the dissolved silicon was present as hexafluorosilicic acid in the etching-baths.

The electrical characteristics of the produced solar cells are compiled in the Table 2.

TABLE 2

The Electrical Characteristics of the Solar Cells of the Example 2 and of the Comparative Experiment CE2

|     | No. of cells produced | $U_{OC}$/V | $I_{SC}$/mA/cm$^2$ | Filling Factor FF/% | Efficiency Eff/% |
| --- | --- | --- | --- | --- | --- |
| 2   | 98,766  | 0.616 | 33.47 | 76.53 | 15.8 |
| CE2 | 100,777 | 0.615 | 33.51 | 76.31 | 15.7 |

The data of the Table 2 confirm the results obtained in the example 1 and the comparative experiment CE1, i.e., the efficiency of the solar cells of the example 2 was higher than the efficiency of the solar cells of the comparative experiment CE2.

After each of the stations mentioned in the example 1, the breakage rates were determined and corrected for breakage due to machine errors (e.g. splinters on the printing sieve). The results obtained from the example 2 are compared with the results obtained from the comparative experiment CE2 in the Table 3.

TABLE 3

The Breakage Rates of Wafers of the Example 2 and of the Comparative Experiment CE2

|     | InTex: Rate/% | Diffusion: Rate/% | PSG: Rate/% | PE-CVD: Rate/% | Printing: Rate/% | Total: Rate/% |
| --- | --- | --- | --- | --- | --- | --- |
| 2   | 0.189 | 0.059 | 0.028 | 0.092 | 0.304 | 0.672 |
| CE2 | 0.306 | 0.085 | 0.024 | 0.137 | 0.315 | 0.867 |

The comparison of the breakage rates in the Table 3 demonstrates that the manufacturing process of the example 2 led to a considerably lower breakage rate.

We claim:

1. An aqueous acidic texturing etching solution, comprising, based on a total weight of the solution:
   3 to 10% by weight of hydrofluoric acid;
   10 to 35% by weight of nitric acid;
   12 to 20% by weight of sulfuric acid; and
   47 to 75% by weight of water.

2. The solution of claim 1, comprising, based on a total weight of the solution:
   4 to 7% by weight of hydrofluoric acid;
   12 to 22% by weight of nitric acid;
   12 to 20% by weight of sulfuric acid; and
   51 to 72% by weight of water.

3. The solution of claim 1, comprising, based on a total weight of the solution:
   5 to 7% by weight of hydrofluoric acid;
   16 to 22% by weight of nitric acid;
   15 to 19% by weight of sulfuric acid; and
   52 to 64% by weight of water.

4. The solution of claim 1, wherein a molar ratio of hydrofluoric acid to nitric acid is from 3:1 to 1:3.7.

5. The solution of claim 2, wherein a molar ratio of hydrofluoric acid to nitric acid is from 1.84:1 to 1:1.75.

6. The solution of claim 3, wherein a molar ratio of hydrofluoric acid to nitric acid is from 1.4:1 to 1:1.4.

7. The solution of claim 1, wherein a molar ratio of hydrofluoric acid to nitric acid is from 1.2:1 to 1:1.2.

8. The solution of claim 1, further comprising hexafluorosilicic acid.

9. A method for texturing a surface of a single crystal and polycrystal silicon substrate, the method comprising:
   (1) contacting a major surface of a single crystal or polycrystal silicon substrate with an aqueous acidic etching solution;
   (2) etching the major surface of the single crystal or polycrystal silicon substrate for a time and at a temperature sufficient to obtain a surface texture comprising a recess and a protrusion; and
   (3) removing the major surface of the single crystal or polycrystal silicon substrate from the contact with the aqueous acidic etching solution, wherein the solution, comprises, based on a total weight of the solution:
   3 to 10% by weight of hydrofluoric acid;
   10 to 35% by weight of nitric acid;
   5 to 40% by weight of sulfuric acid; and
   47 to 82% by weight of water.

10. The method of claim 9, wherein the solution comprises, based on a total weight of the solution:
    4 to 7% by weight of hydrofluoric acid;
    12 to 22% by weight of nitric acid;
    12 to 20% by weight of sulfuric acid; and
    51 to 72% by weight of water.

11. The method of claim 9, wherein the solution comprises, based on a total weight of the solution:
    5 to 7% by weight of hydrofluoric acid;
    16 to 22% by weight of nitric acid;
    15 to 19% by weight of sulfuric acid; and
    52 to 64% by weight of water.

12. The method of claim 9, wherein a molar ratio of hydrofluoric acid to nitric acid is from 3:1 to 1:3.7.

13. The method of claim 10, wherein a molar ratio of hydrofluoric acid to nitric acid is from 1.84:1 to 1:1.75.

14. The method of claim 11, wherein a molar ratio of hydrofluoric acid to nitric acid is from 1.4:1 to 1:1.4.

15. The method of claim 9, wherein a molar ratio of hydrofluoric acid to nitric acid is from 1.2:1 to 1:1.2.

16. The method of claim 9, wherein the solution further comprises hexafluorosilicic acid.

17. The method of claim 9, wherein, during (1), two opposite major surfaces of the single crystal or polycrystal silicon substrate are contacted with the solution.

18. The method of claim 17, wherein the contacting (1) comprises dipping the single crystal or polycrystal silicon substrate entirely into the solution.

19. The method of claim 9, wherein, during (2), the major surface of the single crystal or polycrystal silicon substrate is etched for a time of from 1 to 10 minutes at a temperature of from 0 to 50° C.

20. The method of claim 9, wherein the surface texture comprises a multitude of pits having a depth in the range of from 0.1 to 15μm and a diameter in the range of from 0.1 to 15μm.

21. The method of claim 18, wherein, during (3), the single crystal polycrystal silicon substrate is entirely removed from the solution.

22. A method for manufacturing a device, comprising employing the method of claim 9, wherein the device generates electricity upon exposure to electromagnetic radiation.

23. The method of claim 22, wherein the device is at least one selected from the group consisting of a photovoltaic cell and solar cell.

24. The method of claim 22, wherein the electromagnetic radiation is solar light.

25. An aqueous acidic texturing etching solution, comprising, based on a total weight of the solution:
   3 to 10% by weight of hydrofluoric acid;
   16 to 22% by weight of nitric acid;
   5 to 40% by weight of sulfuric acid; and
   47 to 76% by weight of water.

* * * * *